(12) United States Patent
Schubert et al.

(10) Patent No.: US 8,507,860 B2
(45) Date of Patent: Aug. 13, 2013

(54) TERAHERTZ RESONATOR

(75) Inventors: Eva Schubert, Lincoln, NE (US);
Mathias M. Schubert, Lincoln, NE (US); Tino Hofmann, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 513 days.

(21) Appl. No.: 12/783,917

(22) Filed: May 20, 2010

(65) Prior Publication Data

US 2010/0295635 A1   Nov. 25, 2010

Related U.S. Application Data

(60) Provisional application No. 61/216,659, filed on May 20, 2009.

(51) Int. Cl.
*G01T 1/17* (2006.01)
*G01J 5/08* (2006.01)

(52) U.S. Cl.
USPC .................................. 250/336.1; 250/338.1

(58) Field of Classification Search
USPC .................. 250/336.1, 338.1; 977/720, 722, 977/766, 810; 398/116
See application file for complete search history.

(56) References Cited

U.S. PATENT DOCUMENTS

| | | | |
|---|---|---|---|
| 7,361,916 B2 | 4/2008 | Gorrell et al. | 350/494.1 |
| 2006/0239688 A1 | 10/2006 | Hillis et al. | 398/116 |
| 2010/0245820 A1* | 9/2010 | Schubert et al. | 356/335 |

OTHER PUBLICATIONS

E. Schubert, J. Fahlteich, Th. Hoche, G. Wagner, B. Rauschenbach. "Chiral silicon nanostructures," Nuclear Instruments and Methods in Physics Research B 244 (2006) 40-44.*
Pearson et al. "THz Frequency Receiver Instrumentation for Herschel's Heterodyne Instrument for Far Infrared (HIFI)," Proceedings of SPIE vol. 4850 (2003), p. 650-661.*
C. Patzig, B. Rauschenbach, B. Fuhrmann, and H. S. Leipner. "Growth of Si nanorods in honeycomb and hexagonal-closed-packed arrays using glancing angle deposition," Journal of Applied Physics 103, 024313 (2008), p. 1-6.*
Y.M. Meziani, J. Lusakowski, N. Dyakonova, W. Knap, D. SEliuta, E. SIrmulis, J. Devenson, G. Valusis, F. Boeuf, and T. Skotnicki. "Non-Resonant Detection of Terahertz Radiation by Nanometer Field Effect Transistors," THz Technology, Ultrafast Measurements, and Imaging: p. 269-270.*

* cited by examiner

*Primary Examiner* — Casey Bryant
(74) *Attorney, Agent, or Firm* — Fish & Richardson P.C.

(57) ABSTRACT

A tunable terahertz resonator includes a semiconductor substrate and a metal layer contacting a surface of the semiconductor substrate. A depletion layer is formed in the semiconductor substrate near an interface between the metal layer and the semiconductor substrate. A chiral nanostructure is coupled to the substrate or the metal layer, the chiral nanostructure including a conducting or semiconducting material and having an inductance. A bias circuit applies a bias voltage across the metal layer and the semiconductor substrate to control a capacitance of a tunable capacitor that includes the depletion layer. The chiral nanostructure and the tunable capacitor form a tunable resonant circuit. The tunable terahertz resonator can be used in a terahertz radiation emitter or receiver.

25 Claims, 5 Drawing Sheets

TERAHERTZ RESONATOR

CROSS-REFERENCE TO RELATED APPLICATIONS

This application claims priority to U.S. Provisional Application Ser. No. 61/216,659, filed May 20, 2009. The above application is incorporated herein by reference in its entirety.

STATEMENT AS TO FEDERALLY SPONSORED RESEARCH

This invention was made with government support under Grant No. 0824920 awarded by NSF. The government has certain rights in the invention.

TECHNICAL FIELD

This subject matter is generally related to terahertz resonators.

BACKGROUND

Terahertz radiation (having a frequency from about 0.3 THz to about 30 THz) has many useful properties. For example, it can penetrate many materials, such as plastics, textile, paper, and wood, but is absorbed in metals. Terahertz radiation imaging and sensing can be useful in, for example, medical imaging, security and surveillance, materials characterization, and data communication. Security systems that use terahertz imaging can detect hidden objects under clothes. Terahertz radiation may interact with certain molecules to cause absorption of the radiation, providing spectroscopic fingerprints for the molecules. Terahertz radiation may be used to detect skin cancers not visible to the naked eye. Terahertz radiation can also produce useful information about properties, such as bound and unbound charge carrier modes, of solid state materials.

SUMMARY

In general, in one aspect, an apparatus includes a tunable terahertz resonator and a bias circuit. The tunable terahertz resonator includes a semiconductor substrate; a metal layer contacting a surface of the semiconductor substrate, a depletion layer being formed in the semiconductor substrate near an interface between the metal layer and the semiconductor substrate; and a chiral nanostructure coupled to the substrate or the metal layer, the chiral nanostructure including a conducting or semiconducting material and having an inductance. The bias circuit applies a bias voltage across the metal layer and the semiconductor substrate to control a capacitance of a tunable capacitor that includes the depletion layer, the chiral nanostructure and the tunable capacitor forming a tunable resonant circuit.

Implementations of the apparatus may include one or more of the following features. A control circuit can be provided to adjust a resonant frequency of the resonant circuit by controlling the bias circuit to adjust the capacitance of the depletion layer such that the resonant circuit has a resonant frequency in a range between 0.3 to 30 THz. The control circuit can sweep the bias voltage from a first voltage to a second voltage to cause the resonant frequency of the resonant circuit to sweep from a first frequency to a second frequency. A terahertz transmitter can include the terahertz resonator, and a power source to provide electric power to the tunable terahertz resonator, wherein the tunable terahertz resonator converts the electric power into terahertz electromagnetic radiation that is emitted from the terahertz transmitter. A terahertz detector can include the terahertz resonator, and an amplifier to amplify terahertz radiation received by the tunable terahertz resonator. The chiral nanostructure can include a nanocoil. The bias circuit can provide pulse voltage signals to the tunable terahertz resonator to initiate oscillation of the resonator.

In general, in another aspect, an apparatus includes a tunable terahertz resonator and a bias circuit. The tunable terahertz resonator includes a semiconductor substrate; a plurality of metal regions on the semiconductor substrate, a depletion layer being formed in the semiconductor substrate near an interface between each metal region and the semiconductor substrate, each metal region and corresponding depletion layer and corresponding portion of the semiconductor substrate forming a tunable capacitor; and a plurality of chiral nanostructures each coupled to one of the metal regions, each chiral nanostructure including a conducting or semiconducting material and having an inductance, each chiral nanostructure and the corresponding tunable capacitor forming a tunable terahertz resonant circuit. The bias circuit provides a bias voltage across each metal region and the semiconductor substrate to control a capacitance of the tunable capacitor to control a resonant frequency of the resonant circuit; wherein at least two of the plurality of tunable terahertz resonant circuits can be controlled independently of each other.

Implementations of the apparatus may include one or more of the following features. The chiral nanostructures can include right-handed chiral nanostructures and left-handed chiral nanostructures. The terahertz resonator can be operable in a first mode and a second mode. In the first mode, the number of activated resonant circuits having the right-handed chiral nanostructures is greater than the number of activated resonant circuits having the left-handed chiral nanostructures. In the second mode, the number of activated resonant circuits having the left-handed chiral nanostructures is greater than the number of activated resonant circuits having the right-handed chiral nanostructures. The control circuit can control the bias voltages applied to the at least two tunable terahertz resonant circuits that can be controlled independently of each other to independently adjust the resonant frequencies of the at least two resonant circuits. The bias circuit can provide pulse voltage signals to the tunable terahertz resonator to initiate oscillation of the resonator.

In general, in another aspect, an apparatus includes a tunable terahertz resonator and a bias circuit. The tunable terahertz resonator includes a tunable capacitor; and a three-dimensional nanostructure coupled to the tunable capacitor, the nanostructure having an inductance, the nanostructure and the tunable capacitor forming a resonant circuit. The bias circuit applies a bias voltage across the tunable capacitor, the bias voltage controlling a capacitance of the tunable capacitor such that the resonant circuit has a resonant frequency in a range between 0.3 to 30 THz.

Implementations of the apparatus may include one or more of the following features. The three-dimensional nanostructure can include a chiral nanostructure. The tunable capacitor can include a depletion region in a semiconductor substrate. The nanostructure and the tunable capacitor can be aligned along a first direction, the nanostructure having a footprint that is less than $10^{-8}$ cm$^2$ on a surface perpendicular to the first direction. The bias circuit can provide pulse voltage signals to the tunable terahertz resonator to initiate oscillation of the resonator.

In general, in another aspect, a method includes applying a bias voltage across a metal layer and a semiconductor substrate to control a thickness of a depletion region near an interface between the metal layer and the semiconductor substrate, the depletion region having a capacitance that is dependent on the thickness of the depletion region, the depletion region being electrically coupled to a chiral nanostructure to form a resonant circuit, the chiral nanostructure being made of a conducting or semiconducting material and having an inductance; and controlling the bias voltage to adjust a resonant frequency of the resonant circuit.

Implementations of the method may include one or more of the following features. The nanostructure can have dimensions selected to cause the nanostructure to have a predetermined inductance such that the resonant circuit has a resonant frequency in a range between 0.3 to 30 THz when the bias voltage is within a predetermined range. The method can include receiving a terahertz radiation at the resonant circuit, and processing the received terahertz radiation. The method can include sweeping the bias voltage from a first voltage level to a second voltage level to cause the resonant frequency of the resonant circuit to sweep from a first frequency to a second frequency, and performing spectroscopy on the received terahertz radiation. The method can include providing electric power to the resonant circuit and causing the resonant circuit to emit terahertz radiation. The method can include providing pulse voltage signals to the resonant circuit to initiate oscillation of the resonant circuit.

In general, in another aspect, a method of operating a terahertz resonator includes applying at least one bias voltage to a plurality of tunable terahertz resonant circuits formed on a semiconductor substrate, each resonant circuit including a tunable capacitor electrically coupled to an inductor that includes a chiral nanostructure, the at least one bias voltage being applied to the tunable capacitors to control capacitances of the tunable capacitors, the chiral nanostructure having dimensions selected to cause the chiral nanostructure to have a predetermined inductance such that the resonant circuit has a resonant frequency in a range between 0.3 to 30 THz when the bias voltage is within a predetermined range; and independently controlling the bias voltages applied to at least two of the resonant circuits to independently adjust the resonant frequencies of the at least two resonant circuits.

Implementations may include one or more of the following features. The method can include providing signals to the at least two independently controlled resonant circuits and emitting terahertz radiation from the at least two independently controlled resonant circuits using at least two different terahertz frequencies. The nanostructures can include right-handed chiral nanostructures and left-handed chiral nanostructures that are individually selectable. The method can include operating the resonate circuits in a first mode by activating at least some resonant circuits having the right-handed chiral nanostructures and de-activating at least some resonant structures having the left-handed chiral nanostructures, and operating the resonate circuits in a second mode by activating at least some resonant circuits having the left-handed chiral nanostructures and de-activating at least some resonant structures having the right-handed chiral nanostructures. The method can include providing pulse voltage signals to the tunable terahertz resonator to initiate oscillation of the resonator.

In general, in another aspect, a method of fabricating a resonant circuit includes forming a metal layer on a semiconductor substrate in which a depletion layer is formed near an interface between the metal layer and the semiconductor substrate, the depletion layer having a capacitance; and forming a nanostructure on the metal layer or the semiconductor substrate, the nanostructure being made of a conducting or semiconducting material and having dimensions selected to cause the nanostructure to have a predetermined inductance, the nanostructure and the depletion layer forming a resonant circuit.

Implementations may include one or more of the following features. The resonant circuit can have a resonant frequency in a range between 0.3 to 30 THz when the bias voltage is within a predetermined range. Forming the nanostructure can include using glancing angle deposition to deposit the conducting or semiconducting material to form the nanostructure.

These features allow a user to generate or detect terahertz radiation using devices that are low cost and robust.

DETAILED DESCRIPTION

This disclosure relates to a terahertz resonator that has a nanostructure coupled to a tunable capacitor to form a resonant circuit. The nanostructure has at least one dimension in the nanometer length scale. The nanostructure can be, e.g., a chiral nanostructure such as a nanocoil. The tunable capacitor can be provided by forming a metal layer on a semiconductor substrate to form a Schottky-barrier capacitor whose capacitance depends on the thickness of the Schottky-barrier induced depletion zone. The capacitance is tunable by controlling a bias voltage applied across the metal layer and the semiconductor substrate. The configurations for the nanostructure and the tunable capacitor, and the bias voltage applied to the tunable capacitor, are selected such that the resonant circuit has a resonant frequency in the terahertz range from 0.3 to 30 THz.

Figure 1A:
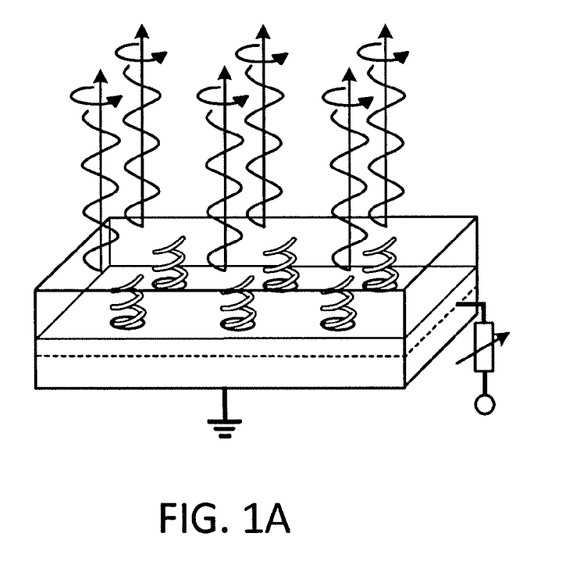
FIG. 1A is a diagram of an example terahertz resonator emitting terahertz radiation.
Figure 1B:
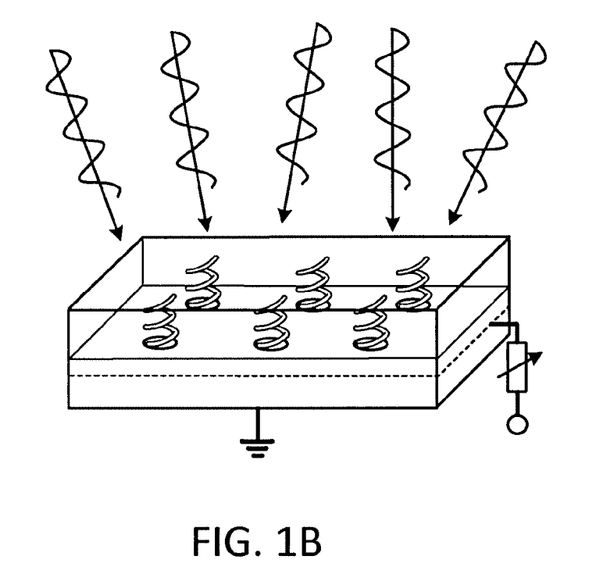
FIG. 1B is a diagram of an example terahertz resonator receiving terahertz radiation.

Referring to FIG. 1A, a terahertz resonator can be part of a transmitter that emits terahertz electromagnetic radiation. In this example, the terahertz resonator includes chiral nanostructures that emit circularly polarized electromagnetic radiation. Referring to FIG. 1B, a terahertz resonator can be part of a detector that detects terahertz electromagnetic radiation. The incoming radiation can be unpolarized, or polarized in any way, such as linear, circular, or elliptical.

Figure 2:
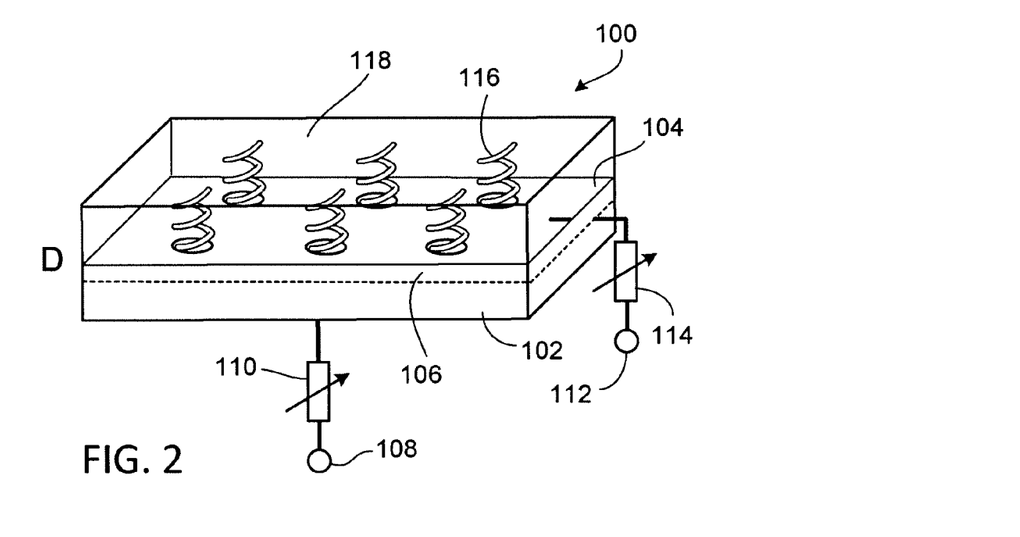
FIGS. 2 to 5 are diagrams of example terahertz resonators.

Referring to FIG. 2, in some implementations, a terahertz resonator 100 includes a p-type doped silicon substrate 102 and a metal layer 104 contacting a surface of the substrate 102. A Schottky-barrier induced depletion layer 106 is formed in the substrate 102 in a region near the surface facing the metal layer 104. The depletion layer 106 has a capacitance. Nanocoils 116, made of metals such as copper (Cu), aluminum (Al), or titanium (Ti), can be grown on the metal layer 104 by, e.g., glancing angle deposition (GLAD). The nanocoil 116 each has an inductance. The nanocoil 116 and the depletion layer 106 form an L-C resonant circuit having a resonant frequency that depends on the inductance of the nanocoil 116 and the capacitance of the depletion layer 106.

An insulating layer 118 can be applied over the nanocoils 116 and filled into the pore volume of the nanocoil and the space between turns of the nanocoil. The insulating layer 118 insulates the turns of the coil and serves as a protective layer. For example, the insulating layer 118 can be made of a dielectric polymer. Polyvinyl phenol (PVP) can be cross-linked with poly (melamine-co-formaldehyde) (PMF), and both the prepolymer and the cross-linking agent can be solved in propylene glycol methyl ether acetate (PGMEA). Spin coating can be used to evenly distribute the polymer on top of the nanocoils 116. Subsequent cross-linking can be achieved by thermal annealing in a vacuum oven.

A first bias voltage is applied to the substrate 102 using a voltage source 108 and an adjustable voltage control 110, which can adjust the bias voltage applied to the substrate 102. A second bias voltage is applied to the metal layer 104 and the nanocoils 116 using a voltage source 112 and an adjustable voltage control 114, which can adjust the bias voltage applied to the metal layer 114 and the nanocoils 116. The bias voltage across the metal layer 104 and the substrate 102 (which is equal to the bias voltage applied to the metal layer 104 minus the bias voltage applied to the substrate 102) affects the thickness of the depletion layer 106, which in turn affects the capacitance of the depletion layer 106. By adjusting the voltage control 110 and the voltage control 114 to change the bias voltage applied across the substrate 102 and the metal layer 104, the resonant frequency of the resonator 100 can be adjusted.

Figure 3:
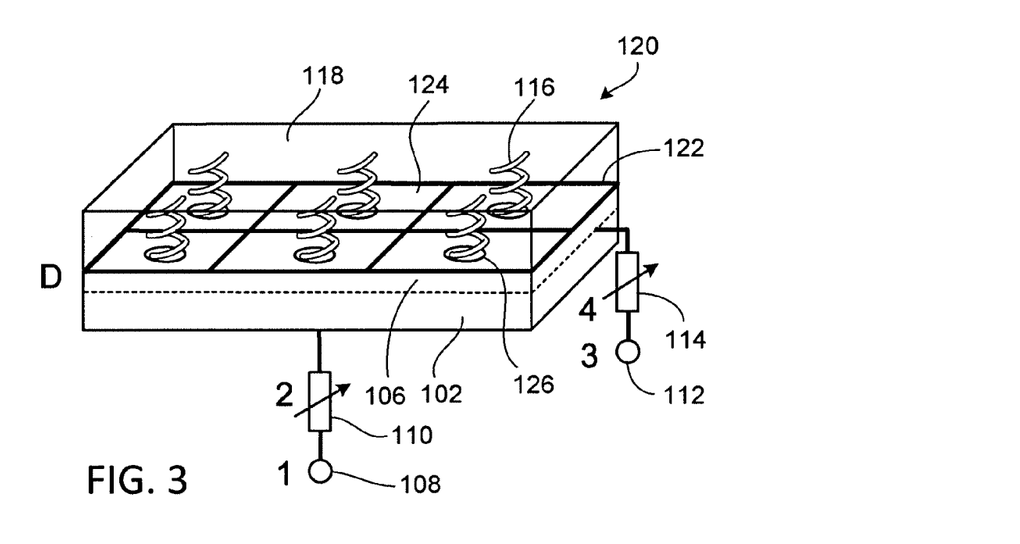

Referring to FIG. 3, in some implementations, instead of using a continuous metal layer 104 as in the example of FIG. 2, a metal grid 122 can be used. The metal grid 122 has openings that expose the surface 124 of the silicon substrate 102. In this example, nanocoils 116 are grown on the surface of the substrate 102 by, e.g., glancing angle deposition (GLAD). The native oxide layer on the silicon substrate 102 is removed using, e.g., wet chemical etching or low-energy ion beam etching, prior to forming the nanocoils 116 on the substrate 102. Similar to the example in FIG. 2, the nanocoils 116 in the example of FIG. 3 can be covered by a layer of dielectric polymer 118.

In this example, a first bias voltage is applied to the substrate 102 using a voltage source 108 and an adjustable voltage control 110. A second bias voltage is applied to the metal grid 122 (but not the nanocoils 116) using a voltage source 112 and an adjustable voltage control 114, which can adjust the bias voltage applied to the metal grid 122. The resonant frequency of the terahertz resonator 120 can be adjusted by adjusting the bias voltage across the metal grid 122 and the substrate 102.

A number of terahertz resonators 120 having different configurations were tested using simulation. Table 1 below shows the dimension of several examples of the terahertz resonator 120. In the table, A represents the area of the nanocoil footprint, l represents the length of the nanocoil 116, N represents the number of turns of the nanocoil 116, d represents the thickness of the depletion layer 106, L represents the inductance of the nanocoil 116, C represents the capacitance of the depletion layer 106, and ν represents the resonant frequency.

TABLE 1

| A (cm2) | l (μm) | N | d (nm) | L (Vs/A) | C (As/V) | ν (THz) |
|---|---|---|---|---|---|---|
| $4 \times 10^{-10}$ | 2.5 | 10 | 100 | $2 \times 10^{-12}$ | $3.5 \times 10^{-18}$ | 29 |
| $4 \times 10^{-10}$ | 2.5 | 10 | 10 | $8 \times 10^{-12}$ | $3.5 \times 10^{-17}$ | 9 |
| $4 \times 10^{-10}$ | 2.5 | 10 | 5 | $8 \times 10^{-12}$ | $7.0 \times 10^{-17}$ | 6.7 |
| $4 \times 10^{-10}$ | 1.25 | 5 | 10 | $1 \times 10^{-12}$ | $3.5 \times 10^{-17}$ | 27 |
| $4 \times 10^{-10}$ | 1.25 | 5 | 5 | $1 \times 10^{-12}$ | $7.0 \times 10^{-17}$ | 19 |

Figure 4:
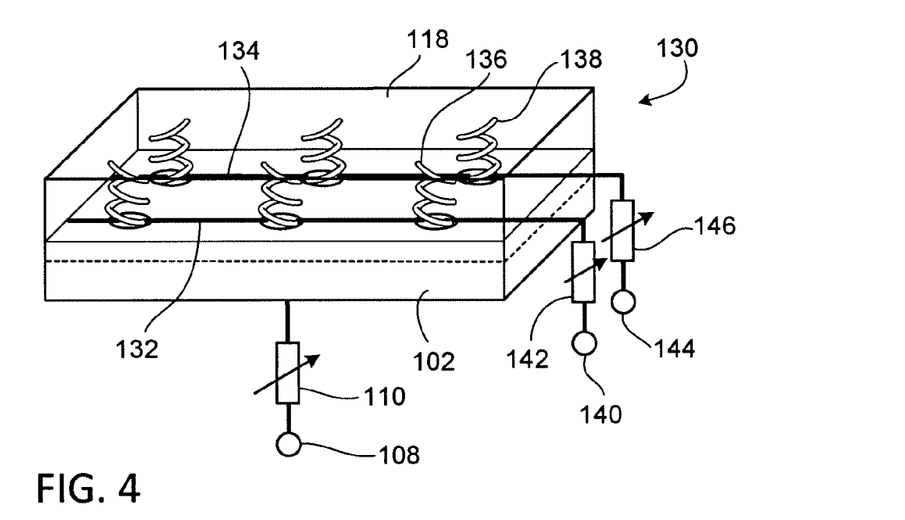

Referring to FIG. 4, in some implementations, the metal layer can be configured to allow individual control of groups of resonators. For example, a terahertz resonator 130 includes a first metal strip 132 and a second metal strip 134 both formed on a surface of a p-type silicon substrate 102. Left-handed nanocoils 136 are grown above the metal strip 132, and right-handed nanocoils 138 are grown above the metal strip 134. Similar to the example in FIG. 2, the nanocoils 136 and 138 in the example of FIG. 4 can be covered by a layer of dielectric polymer 118.

A bias voltage is applied to the substrate 102 using a voltage source 108 and an adjustable voltage control 110. A bias voltage is applied to the metal strip 132 and the nanocoils 136 using a voltage source 140 and an adjustable voltage control 142. A bias voltage is applied to the metal strip 134 and the nanocoils 138 using a voltage source 144 and an adjustable voltage control 146. By controlling the adjustable voltage controls 142 and 146, the left-handed nanocoils 132 and the right-handed nanocoils 134 can be independently activated or selected.

For example, the left-handed nanocoils 132 can be activated by applying a bias voltage to the metal strip 132 to cause the resonant circuits formed by the nanocoils 132 and the depletion layer beneath the metal strip 132 to have a resonant frequency in the terahertz range 0.3 to 30 THz. The right-handed nanocoils 134 can be de-activated by either not applying a bias voltage to the metal strip 134 or applying a bias voltage to the metal strip 134 such that no oscillation occurs for the resonant circuits that includes the nanocoils 134.

When only the left-handed nanocoils 132 are activated, the terahertz resonator 130 can be used to transmit or receive left-handed circularly polarized terahertz electromagnetic waves. When only the right-handed nanocoils 134 are activated, the terahertz resonator 130 can be used to transmit or receive right-handed circularly polarized terahertz electromagnetic waves. When both left-handed and right-handed nanocoils 132 and 134 are activated, the terahertz resonator 130 can be used to transmit or receive both left-handed and right-handed circularly polarized terahertz electromagnetic waves.

In some implementations, the relative percentages of the activated left-handed nanocoils versus activated right-handed nanocoils can be varied. By varying the relative percentages of left-handed and right-handed nanostructures, the terahertz resonator 130 can become preferentially selective for either one of the polarization, and act as a polarizer.

In some implementations, the terahertz resonator 130 can become preferentially selective for either one of the polarization by electronically emphasizing the signals received from the respective nanocoils during terahertz detection, or by selectively stimulating (amplitude) the respective nanocoils during terahertz emission.

The resonator structure 130 can be configured to detect or emit either left or right handed elliptical, circular and linear polarization. If as described above the resonator structure 130 is asymmetrically amplified (at the same bias voltage for the same resonant frequency), or asymmetrically loaded with nanostructures, the resulting transmittance or acceptance characteristic can be chosen to match that of either left or right-handed elliptically polarized light.

Furthermore, if a phase shift is induced by the amplifier such that the transmitted and detected signals for both left and right handed resonator structures are delayed between zero and 360 degrees, and if both left and right handed amplitudes are the same, linear polarized light will be preferentially detected, or emitted.

Figure 5:
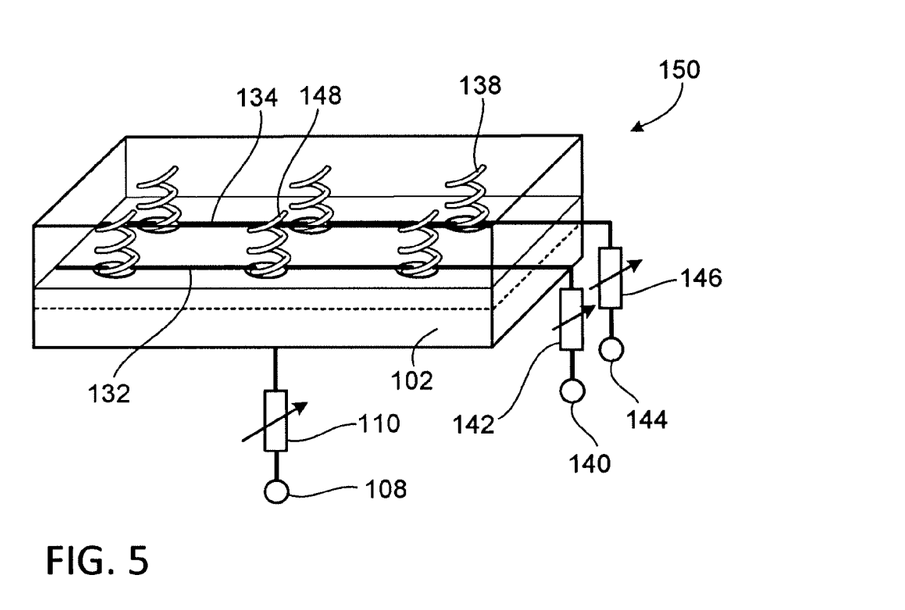

Referring to FIG. 5, in some implementations, a terahertz transmitter 150 having two or more groups of nanocoils (e.g., 138 and 148) can form a phased-array transmitter. The nanocoils of different groups can have the same configuration (e.g., can be all right-handed or left-handed) but receive signals from signal sources (not shown in the figure) having different phases. The interferences among the terahertz electromagnetic waves emitted by the different groups of nanocoils cause the envelope of the terahertz radiation to have particular shapes. For example, the signals sent to the groups of nanocoils (e.g., 138 and 148) can be configured such that a narrow terahertz beam is emitted from the terahertz resonator 150. The signals sent to the groups of nanocoils can be configured such that the beam direction changes over time.

The bias voltages applied to different groups of resonant circuits can be different such that different groups of resonant circuits have different resonant frequencies. For example, the adjustable voltage control 142 and the adjustable voltage control 146 can be independently controlled to provide different bias voltages to the metal strips 132 and 134. This allows the resonator 150 to emit or detect terahertz radiation at multiple frequencies at the same time.

FIG. 5 only shows two metal strips and two groups of nanocoils. Because the nanocoils have very small dimensions, the terahertz resonator 150 can have many (e.g., hundreds or more) groups of nanocoils that can be individually controlled. When operating as a phased-array transmitter, the groups of nanocoils can generate highly directional terahertz electromagnetic waves. In a phased-array transmitter, individual resonant circuits are operated with a phase delay relative to one another so as to produce a highly directional radiation emitting from the surface of the array.

Similarly, when operating as a phased-array receiver, the groups of nanocoils can function as a highly directional antenna that is particularly sensitive to detecting terahertz electromagnetic waves propagating along a certain direction relative to the surface of the terahertz resonator. In a phased-array receiver, individual resonant circuits are operated with a phase delay relative to one another so as to produce a highly directional sensitivity to the incident radiation.

Figure 6:
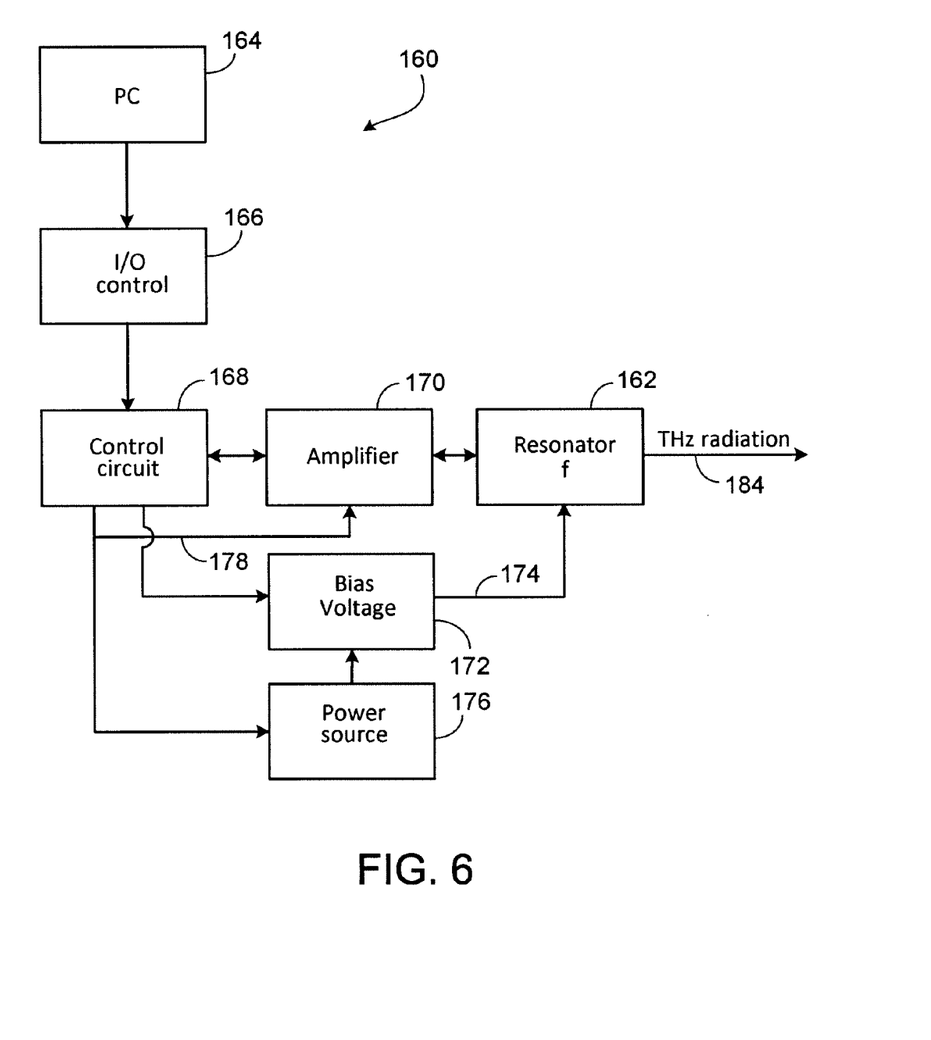
FIG. 6 is a block diagram of a terahertz transmitter.

Referring to FIG. 6, in some implementations, a terahertz transmitter 160 includes a terahertz resonator 162 having a resonant frequency in the terahertz range 0.3 to 30 THz. The resonator 162 can be similar to, e.g., the resonator 100 (FIG. 2), 120 (FIG. 3), 130 (FIG. 4), or 150 (FIG. 5). A computer 164, such as a personal computer, provides a user interface to allow a user to conveniently control the operations of the terahertz transmitter 160. The computer 164 controls a control circuit 168 through an input/output control interface 166. The control circuit 168 sends signals (e.g., pulse signals) to an amplifier 170, which amplifies the signals and sends the output to the resonator 162. The control circuit 168 may control the gain of the amplifier using a control signal line 178. The control circuit 168 controls a bias voltage generator 172 that provides a bias voltage 174 to the resonator 162 to control the resonant frequency of the resonator 162. The control circuit 168 also controls a power source 176, which provides power to the bias voltage generator 172.

During startup of the terahertz transmitter 160, the control circuit 168 causes the bias voltage generator 172 to provide a DC bias voltage, and the amplifier 170 to provide short-pulse voltage sequences so as to bring the resonator 162 into oscillation. The output of the resonator 162 is terahertz radiation 184. The terahertz electromagnetic waves transmitted by the terahertz transmitter 160 can be modulated to carry information, such as voice or data. In some examples, the amplifier 170 amplifies a small voltage modulation from the control circuit 168 and provides the amplified voltage modulation to the resonator 162.

The computer 164 can control the bias voltage to sweep from a first voltage level to a second voltage level to cause the resonant frequency of the resonator 162 to sweep from a first frequency to a second frequency. This causes the transmitter 160 to emit terahertz radiation having a frequency that sweeps from the first frequency to the second frequency. This is useful when performing spectroscopy. The terahertz radiation can be directed to a compound or object, and the reflected or transmitted radiation can be analyzed to determine the properties of the object.

The computer 164 may provide a user interface for interacting with a user, including receiving commands from the user indicating the desired frequency or frequency range of the terahertz radiation 184. The computer 164 may include storage to store instruction code that is executed by the computer to perform the various tasks described here.

Figure 7:
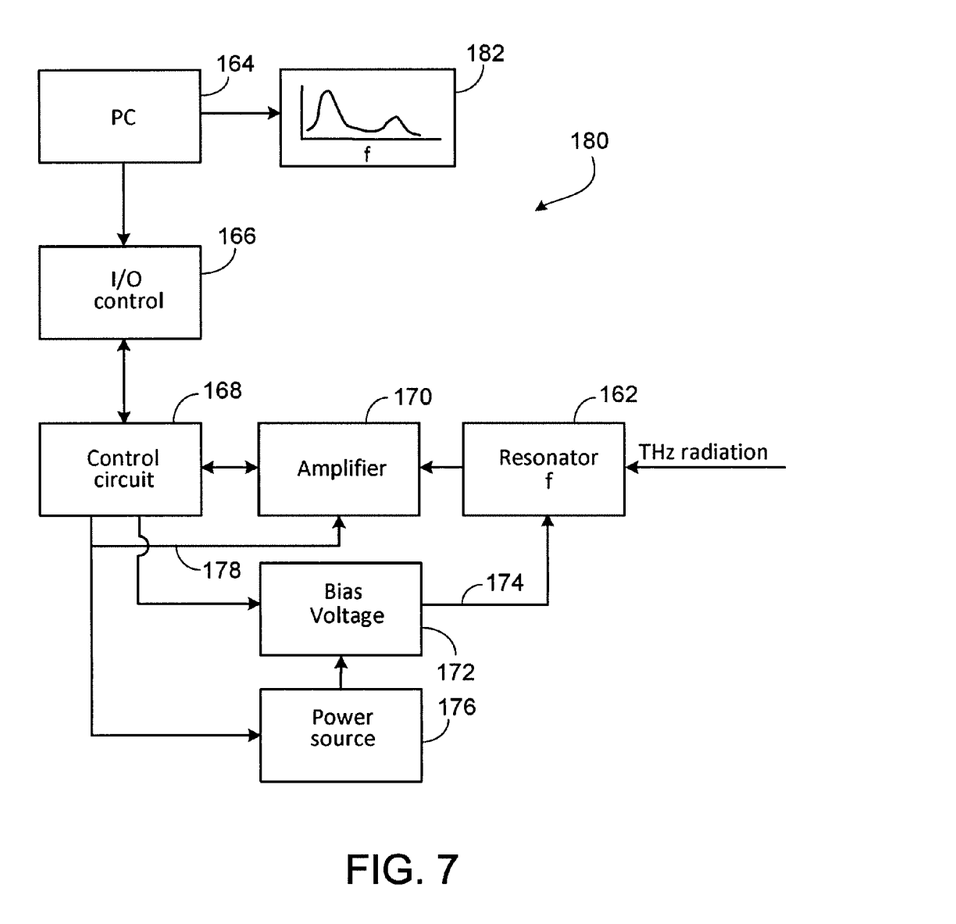
FIG. 7 is a block diagram of a terahertz receiver.

Referring to FIG. 7, in some implementations, a terahertz detector 180 includes a terahertz resonator 162 having a resonant frequency in the terahertz range 0.3 to 30 THz. A computer 164 provides a user interface to allow a user to conveniently control the operations of the terahertz detector 180. The computer 164 controls a control circuit 168 through an input/output control interface 166. The control circuit 168 may control the gain of an amplifier 170 using a control signal line 178. The control circuit 168 controls a bias voltage generator 172 that provides a bias voltage 174 to control the resonant frequency of the resonator 162. A power source 176 provides power to the bias voltage generator 172.

During startup of the terahertz detector 180, the control circuit 168 causes the bias voltage generator 172 to provide a DC bias voltage. When the terahertz detector 180 receives terahertz electromagnetic waves having a frequency that matches the resonant frequency of the resonator 162, the amplitudes of the resonant oscillations will augment a small bias voltage variation, according to the strength of the received signal. The small variations in the bias voltage (representing the received signal) are differentiated from the supplied bias voltage and amplified by the amplifier 170, and processed via the control circuit 168, the input/output control unit 166, and the computer 164.

The computer 164 can control the bias voltage to sweep from a first voltage level to a second voltage level to cause the resonant frequency of the resonator 162 to sweep from a first frequency to a second frequency. The computer 164 records the signal strength of the received signals at various frequencies and performs a spectroscopy of the incident radiation. A spectral analysis of the incident radiation can be displayed as a graph 182.

The computer 164 may provide a user interface for interacting with a user, including receiving commands from the user and displaying results of spectral analyses. The computer 164 may include storage to store instruction code that is executed by the computer to perform the various tasks described here.

In some implementations, the terahertz resonator can have an array of rows and columns of nanostructures that can be individually accessed through row and column control lines. The terahertz resonator can be used in a terahertz display or projector for displaying or projecting two-dimensional images in the terahertz spectrum. The terahertz resonator can also be used in a terahertz sensor for sensing two-dimensional images in the terahertz spectrum.

For example, an active switch (such as a transistor) can be provided at each intersection of the row and column control lines. Each intersection of the row and column control lines corresponds to a "pixel" in the terahertz display or sensor. A row of resonant circuits can be activated, and the column lines can be used to send different signals to different resonant circuits or receive signals from the resonant circuits. Different rows of resonant circuits can be sequentially activated to generate different row portions of the transmitted or received image.

In some implementations, the terahertz resonator can have an array of rows and columns of groups of nanostructures, in which each group of nanostructure can be individually accessed. For example, each active switch can be associated with two or more nanocoils. This may increase the sensitivity of each pixel in the sensor and reduce noise in the detected image.

As described above, the terahertz transmitter 160 can be used as polarization state generator (PSG), and the terahertz detector 180 can be used as polarization state detector (PSD). A polarization state generator includes a light source and a set of arbitrarily configurable polarizer components to achieve all polarization characterized as linear, elliptical, or circular, covering both handedness, and all 360 degree spatial preference directions for linear and elliptical polarizations, and all ellipticities. A polarization state detector includes a light detector and a set of arbitrarily configurable polarizer components to achieve all polarization characterized as linear, elliptical, circular, covering both handedness, and all 360 degree spatial preference directions for linear and elliptical polarizations, and all ellipticities. An ellipsometer includes a polarization-tunable PSG device and a polarization-tunable PSD device. Therefore, a combination of the terahertz transmitter 160 and the terahertz detector 180 can be used to operate an ellipsometer system, with the terahertz transmitter emitting radiation that is projected on a sample, and the terahertz receiver detecting radiation reflected from or transmitted through the sample. Because the terahertz transmitter 160 and the terahertz detector 180 can be tuned spectrally, this ellipsometer can be operated as a spectral ellipsometer in the terahertz spectral region.

An advantage of the terahertz resonators described above is that they can be small and low cost. Although nanocoils were used in the examples described above, other nanostructures, either chiral or achiral, can also be used. For example, the resonators can include achiral nanostructures, such as vertical posts and slanted posts.

In some implementations, the nanostructures can be generated in a self-organized growth process by using glancing angle deposition (GLAD) accompanied with a controlled substrate motion. For example, the substrate 102 can be rotated continuously to form nanocoils. Sculptured thin films with tailored designs can be grown from a broad variety of different materials (semiconductors and metals) by using physical vapor deposition methods. Glancing angle deposition is a method to generate three-dimensional (3D) chiral nanostructures from a concurrent growth mechanism due to geometrical shadowing in combination with kinetic limitation for surface adatoms. This technique uses a particle flux reaching the substrate under an oblique angle of incidence (for example, greater than 80°). These conditions support a columnar growth, and the instantaneous change of the growth direction due to a simple variation of the incident vapor flux (by substrate rotation) allows for the fabrication of 3D nanostructures with manifold morphologies.

Some description of the principles of sculptured thin film preparation by glancing angle deposition can be found in "Uniaxial magnetic anisotropy in cobalt films induced by oblique deposition of an ultrathin cobalt underlayer," by M. T. Umlor, Appl. Phys. Lett. 87, 082505 (2005).

Glancing angle deposition sculptured thin film can be prepared using, for example, semiconducting materials, such as silicon. Metal (for example, Co, Cu, W, Al) nanorods, whiskers, and nanopillars can also be grown using glancing angle deposition. Sculptured thin films from metal with morphologies that render chiral structures can also be grown using glancing angle deposition.

A calibration of the resonators may be performed such that the resonant frequencies are measured for different bias voltages. The calibration data may be stored in the storage of the computer 164. When the resonators are used to generate or detect terahertz radiation of a particular frequency, the calibration data are retrieved and the resonators are biased to a corresponding voltage.

Although some examples have been discussed above, other implementations and applications are also within the scope of the following claims. For example, the nanostructures can have shapes and sizes that are different from those described above. The nanostructures can be, for example, a three-dimensional object with dimensions in the nanometer length scale, with one spatial extension longer than the two remaining spatial extensions, and having kinks and curvatures along the long extension so as to form, e.g., straight wires, zigzags, staircases, zigzagged or continuous coils. The metal layer and nanostructures can be made from materials that are different from those described above. The substrate 102 can be either n-type or p-type, and can be made of any other type of semiconductor material that is capable of forming a metal Schottky barrier induced depletion layer.

The various examples and features described above related to data processing can be implemented in digital electronic circuitry, or in computer hardware, firmware, software, or in combinations of them. The features can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

What is claimed is:

1. An apparatus comprising:
a tunable terahertz resonator comprising:
a semiconductor substrate;
a metal layer contacting a surface of the semiconductor substrate, a depletion layer being formed in the semiconductor substrate near an interface between the metal layer and the semiconductor substrate; and
a chiral nanostructure coupled to the substrate or the metal layer, the chiral nanostructure comprising a conducting or semiconducting material and having an inductance; and
a bias circuit to apply a bias voltage across the metal layer and the semiconductor substrate to control a capacitance of a tunable capacitor comprising the depletion layer, the chiral nanostructure and the tunable capacitor forming a tunable resonant circuit.

2. The apparatus of claim 1, comprising a control circuit to adjust a resonant frequency of the resonant circuit by controlling the bias circuit to adjust the capacitance of the depletion layer such that the resonant circuit has a resonant frequency in a range between 0.3 to 30 THz.

3. The apparatus of claim 2 in which the control circuit sweeps the bias voltage from a first voltage to a second voltage to cause the resonant frequency of the resonant circuit to sweep from a first frequency to a second frequency.

4. The apparatus of claim 1, comprising a terahertz transmitter that comprises the terahertz resonator, and a power source to provide electric power to the tunable terahertz resonator, wherein the tunable terahertz resonator converts the electric power into terahertz electromagnetic radiation that is emitted from the terahertz transmitter.

5. The apparatus of claim 1, comprising a terahertz detector that comprises the terahertz resonator, and an amplifier to amplify terahertz radiation received by the tunable terahertz resonator.

6. The apparatus of claim 1 in which the chiral nanostructure comprises a nanocoil.

7. The apparatus of claim 1 in which the bias circuit provides pulse voltage signals to the tunable terahertz resonator to initiate oscillation of the resonator.

8. An apparatus comprising:
a tunable terahertz resonator comprising:
a semiconductor substrate;
a plurality of metal regions on the semiconductor substrate, a depletion layer being formed in the semiconductor substrate near an interface between each metal region and the semiconductor substrate, each metal region and corresponding depletion layer and corresponding portion of the semiconductor substrate forming a tunable capacitor; and
a plurality of chiral nanostructures each coupled to one of the metal regions, each chiral nanostructure comprising a conducting or semiconducting material and having an inductance, each chiral nanostructure and the corresponding tunable capacitor forming a tunable terahertz resonant circuit; and
a bias circuit to provide a bias voltage across each metal region and the semiconductor substrate to control a capacitance of the tunable capacitor to control a resonant frequency of the resonant circuit;
wherein at least two of the plurality of tunable terahertz resonant circuits can be controlled independently of each other.

9. The apparatus of claim 8 in which the chiral nanostructures comprise right-handed chiral nanostructures and left-handed chiral nanostructures, and the terahertz resonator is operable in a first mode in which the number of activated resonant circuits having the right-handed chiral nanostructures is greater than the number of activated resonant circuits having the left-handed chiral nanostructures, and a second mode in which the number of activated resonant circuits having the left-handed chiral nanostructures is greater than the number of activated resonant circuits having the right-handed chiral nanostructures.

10. The apparatus of claim 8 in which the control circuit controls the bias voltages applied to the at least two tunable terahertz resonant circuits that can be controlled independently of each other to independently adjust the resonant frequencies of the at least two resonant circuits.

11. The apparatus of claim 8 in which the bias circuit provides pulse voltage signals to the tunable terahertz resonator to initiate oscillation of the resonator.

12. An apparatus comprising:
a tunable terahertz resonator comprising:
a tunable capacitor; and
a three-dimensional chiral nanostructure coupled to the tunable capacitor, the nanostructure having an inductance, the nanostructure and the tunable capacitor forming a resonant circuit; and
a bias circuit to apply a bias voltage across the tunable capacitor, the bias voltage controlling a capacitance of the tunable capacitor such that the resonant circuit has a resonant frequency in a range between 0.3 to 30 THz.

13. The apparatus of claim 12 in which the tunable capacitor comprises a depletion region in a semiconductor substrate.

14. The apparatus of claim 12 in which the nanostructure and the tunable capacitor are aligned along a first direction, the nanostructure having a footprint that is less than $10^{-8}$ cm$^2$ on a surface perpendicular to the first direction.

15. The apparatus of claim 12 in which the bias circuit provides pulse voltage signals to the tunable terahertz resonator to initiate oscillation of the resonator.

16. A method of operating a terahertz resonator, the method comprising:
applying a bias voltage across a metal layer and a semiconductor substrate to control a thickness of a depletion region near an interface between the metal layer and the semiconductor substrate, the depletion region having a capacitance that is dependent on the thickness of the depletion region,
the depletion region being electrically coupled to a chiral nanostructure to form a resonant circuit, the chiral nanostructure being made of a conducting or semiconducting material and having an inductance; and
controlling the bias voltage to adjust a resonant frequency of the resonant circuit.

17. The method of claim 16 in which the nanostructure has dimensions selected to cause the nanostructure to have a predetermined inductance such that the resonant circuit has a resonant frequency in a range between 0.3 to 30 THz when the bias voltage is within a predetermined range.

18. The method of claim 16, comprising receiving a terahertz radiation at the resonant circuit, and processing the received terahertz radiation.

19. The method of claim 18, comprising sweeping the bias voltage from a first voltage level to a second voltage level to cause the resonant frequency of the resonant circuit to sweep from a first frequency to a second frequency, and performing spectroscopy on the received terahertz radiation.

20. The method of claim 16, comprising providing electric power to the resonant circuit and causing the resonant circuit to emit terahertz radiation.

21. The method of claim 16, comprising providing pulse voltage signals to the resonant circuit to initiate oscillation of the resonant circuit.

22. A method of operating a terahertz resonator, the method comprising:

applying at least one bias voltage to a plurality of tunable terahertz resonant circuits formed on a semiconductor substrate, each resonant circuit comprising a tunable capacitor electrically coupled to an inductor comprising a chiral nanostructure, the at least one bias voltage being applied to the tunable capacitors to control capacitances of the tunable capacitors, the chiral nanostructure having dimensions selected to cause the chiral nanostructure to have a predetermined inductance such that the resonant circuit has a resonant frequency in a range between 0.3 to 30 THz when the bias voltage is within a predetermined range; and independently controlling the bias voltages applied to at least two of the resonant circuits to independently adjust the resonant frequencies of the at least two resonant circuits.

23. The method of claim 22, comprising providing signals to the at least two independently controlled resonant circuits and emitting terahertz radiation from the at least two independently controlled resonant circuits using at least two different terahertz frequencies.

24. The method of claim 22 in which the nanostructures comprise right-handed chiral nanostructures and left-handed chiral nanostructures that are individually selectable, and the method comprises:

operating the resonate circuits in a first mode by activating resonant circuits having the right-handed chiral nanostructures and de-activating resonant structures having the left-handed chiral nanostructures, and operating the resonate circuits in a second mode by activating resonant circuits having the left-handed chiral nanostructures and de-activating resonant structures having the right-handed chiral nano structures.

25. The method of claim 22, comprising providing pulse voltage signals to the tunable terahertz resonator to initiate oscillation of the resonator.

* * * * *